(12) United States Patent
Xiao

(10) Patent No.: US 10,129,992 B2
(45) Date of Patent: Nov. 13, 2018

(54) ANTI-TOPPLE DEVICE

(71) Applicant: ScienBiziP Consulting (Shenzhen) Co., Ltd., Shenzhen (CN)

(72) Inventor: Jian-Gang Xiao, Shenzhen (CN)

(73) Assignee: ScienBiziP Consulting (Shenzhen) Co., Ltd., Shenzhen (CN)

(*) Notice: Subject to any disclaimer, the term of this patent is extended or adjusted under 35 U.S.C. 154(b) by 0 days.

(21) Appl. No.: 15/289,253

(22) Filed: Oct. 10, 2016

(65) Prior Publication Data
US 2018/0063977 A1    Mar. 1, 2018

(30) Foreign Application Priority Data
Aug. 30, 2016  (CN) .......................... 2016 1 0758920

(51) Int. Cl.
| H05K 5/02 | (2006.01) |
| H05K 7/14 | (2006.01) |
| A47B 91/08 | (2006.01) |
| A47B 97/00 | (2006.01) |

(52) U.S. Cl.
CPC ........... *H05K 5/0234* (2013.01); *A47B 91/08* (2013.01); *H05K 7/1488* (2013.01); *A47B 2097/008* (2013.01)

(58) Field of Classification Search
CPC .... H05K 5/0234; H05K 7/1488; H02B 1/303; F25D 2323/0011; F24C 15/083; D06F 39/125; A47L 15/4253; A47L 15/427; A47B 91/005; A47B 91/08; A47B 2097/008

USPC ... 248/500, 501, 188.1, 188.2, 188.4, 188.8, 248/680, 223.41; 312/351.1, 351.7
See application file for complete search history.

(56) References Cited

U.S. PATENT DOCUMENTS

| 4,199,072 | A | * | 4/1980 | Jacks | ...................... | H02B 1/40 |
| | | | | | | 220/3.4 |
| 4,890,813 | A | * | 1/1990 | Johnson | ................. | A47B 97/00 |
| | | | | | | 248/500 |
| 4,991,805 | A | * | 2/1991 | Solak | ....................... | F16M 7/00 |
| | | | | | | 248/188.4 |
| 5,192,123 | A | * | 3/1993 | Wallin | .................... | A47B 96/00 |
| | | | | | | 248/500 |
| 6,059,251 | A | * | 5/2000 | Gutelius, Jr. | .......... | A47B 91/08 |
| | | | | | | 248/499 |
| 6,134,858 | A | * | 10/2000 | Gutelius, Jr. | .......... | A47B 91/08 |
| | | | | | | 248/499 |
| 6,155,662 | A | * | 12/2000 | Fookes | ................... | A47B 47/00 |
| | | | | | | 248/678 |
| 6,408,482 | B1 | * | 6/2002 | Henriott | ................. | A47B 21/06 |
| | | | | | | 16/29 |

(Continued)

*Primary Examiner* — Jonathan Liu
*Assistant Examiner* — Guang H Guan
(74) *Attorney, Agent, or Firm* — ScienBiziP, P.C.

(57) ABSTRACT

An anti-topple device for preventing a cabinet from swaying or falling over includes a pedestal, a screw, a first adjusting member, a second adjusting member, and a connecting member. The pedestal is fixed on a floor and the screw is fixed to the pedestal. The first adjusting member and the second adjusting member are slidably mounted on the screw to make the cabinet height adjustable. The connecting member secures onto two beams of the cabinet positioned at a bottom of the cabinet to hold the cabinet firmly against the floor. The two beams flank the screw on opposite sides to firmly fix the cabinet to the floor.

14 Claims, 4 Drawing Sheets

(56) References Cited

U.S. PATENT DOCUMENTS

| | | | | | |
|---|---|---|---|---|---|
| 6,817,687 | B1* | 11/2004 | Neeld | ................ | A47B 91/08 312/351.1 |
| 7,780,128 | B2* | 8/2010 | Walsberg | ............ | A47B 91/024 248/188.2 |
| 8,237,052 | B2* | 8/2012 | Adducci | ............... | H02B 1/202 174/17 R |
| 8,393,253 | B2* | 3/2013 | Johnson | ............... | B25B 13/065 81/124.6 |
| 8,419,328 | B2* | 4/2013 | Hsiao | ................ | H05K 7/1497 410/87 |
| 8,602,701 | B2* | 12/2013 | Hsiao | ................ | H05K 7/1497 410/33 |
| 8,717,767 | B2* | 5/2014 | Liang | ................. | H05K 7/1491 174/100 |
| 8,925,893 | B2* | 1/2015 | Biedenweg | .......... | B60P 7/0807 248/500 |
| 2002/0014573 | A1* | 2/2002 | Anderson | ............... | F16M 7/00 248/677 |
| 2012/0146474 | A1* | 6/2012 | Taylor | ................. | A47B 77/08 312/334.4 |
| 2014/0138509 | A1* | 5/2014 | Lehman | ............... | A47B 91/12 248/346.11 |

\* cited by examiner

ANTI-TOPPLE DEVICE

CROSS-REFERENCE TO RELATED APPLICATIONS

This application claims priority to Chinese Patent Application No. 201610758920.9, filed on Aug. 30, 2016, the contents of which are incorporated by reference herein.

FIELD

The subject matter herein generally relates to container structures and stability of structures.

BACKGROUND

Cabinets are configured to store objects. Generally, the center of gravity of the cabinet is high, particularly when the stored objects are heavy and stored on high shelves. Thus, the cabinet may topple during movement, and there is a need to prevent damage to the stored objects and the cabinet by preventing the cabinet from swaying or falling over. There is also potential risk of the cabinet falling onto a person. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
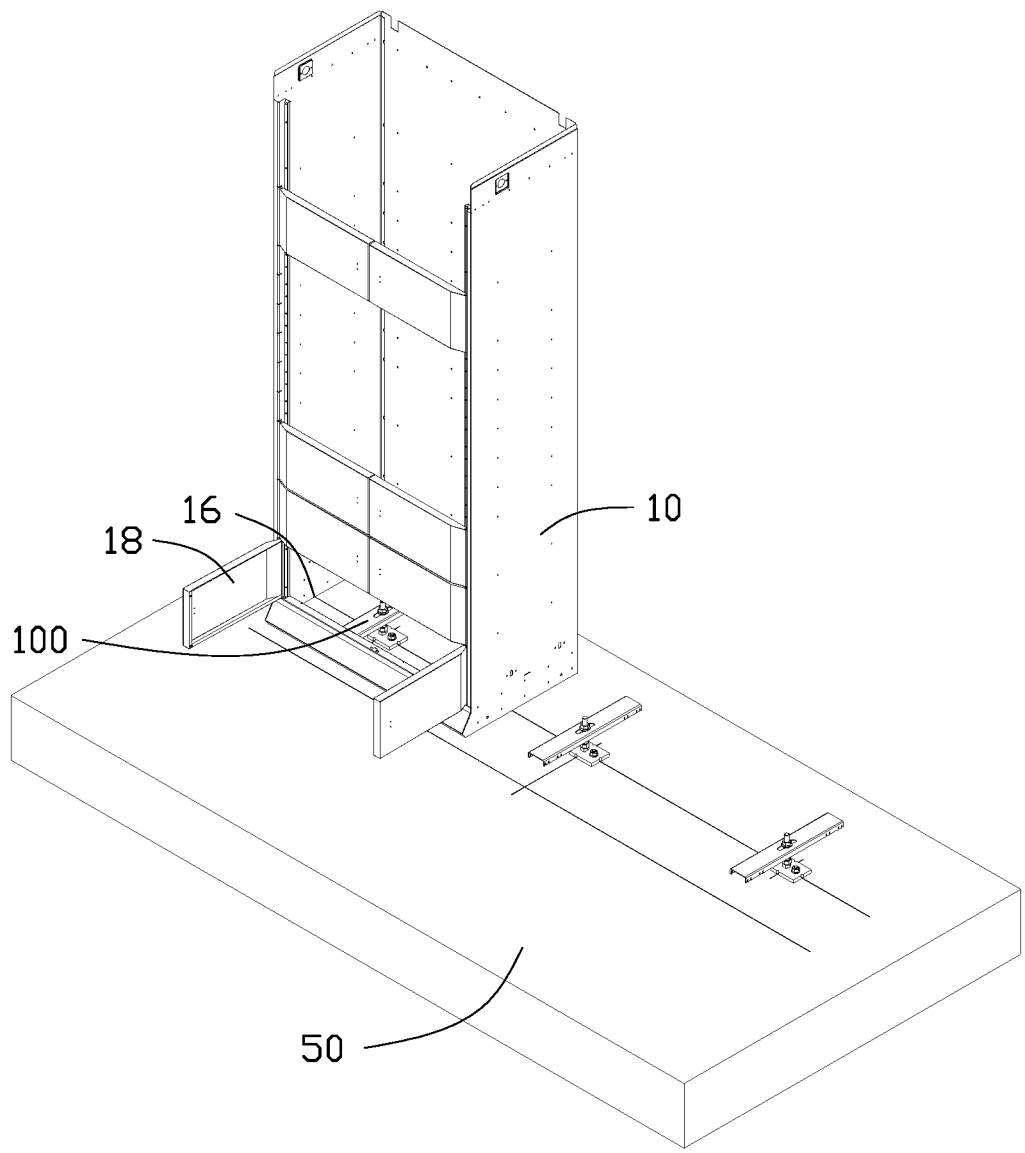
FIG. 1 is an isometric view of an exemplary embodiment of an anti-topple device mounted to a cabinet.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "comprising" means "including, but not necessarily limited to"; it specifically indicates open-ended inclusion or membership in a so-described combination, group, series, and the like.

Figure 2:
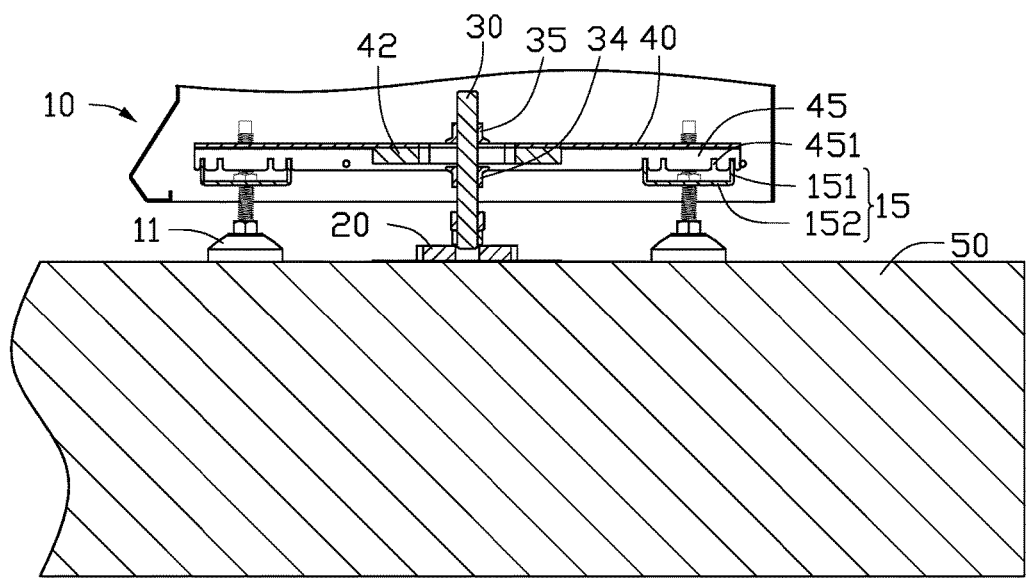
FIG. 2 is a cross-sectional view taken along the line II-II of FIG. 1.

FIGS. 1 and 2 illustrate an anti-topple device 100 mounted on a floor 50 to prevent a cabinet 10 from falling over. The anti-topple device 100 includes a pedestal 20, a screw 30, a first adjusting member 34, a second adjusting member 35, a connecting member 40, and an elastic block 42. The screw 30 is mounted to the pedestal 20. The connecting member 40 and the elastic block 42 are slidably mounted to the screw 30 and abut against the first adjusting member 34 and the second adjusting member 35. The connecting member 40 is fixed to the cabinet 10 to prevent the cabinet 10 from swaying or falling over. The cabinet 10 may contain a data center.

The cabinet 10 includes two beams 15 mounted at the bottom of the cabinet 10 and two supporting members 11 mounted under the two beams 15 to support the two beams 15. The screw 30 is positioned between the two beams 15. Each beam 15 includes a supporting plate 152 and two fastening plates 151 perpendicularly extended upward from opposite ends of the supporting plate 152. A gap 16 is defined between the two adjacent fastening plates 151 of two beams 15. The cabinet 10 includes two doors 18 in front of the gap 16. The two doors 18 are configured to close or open the gap 16.

Figure 3:
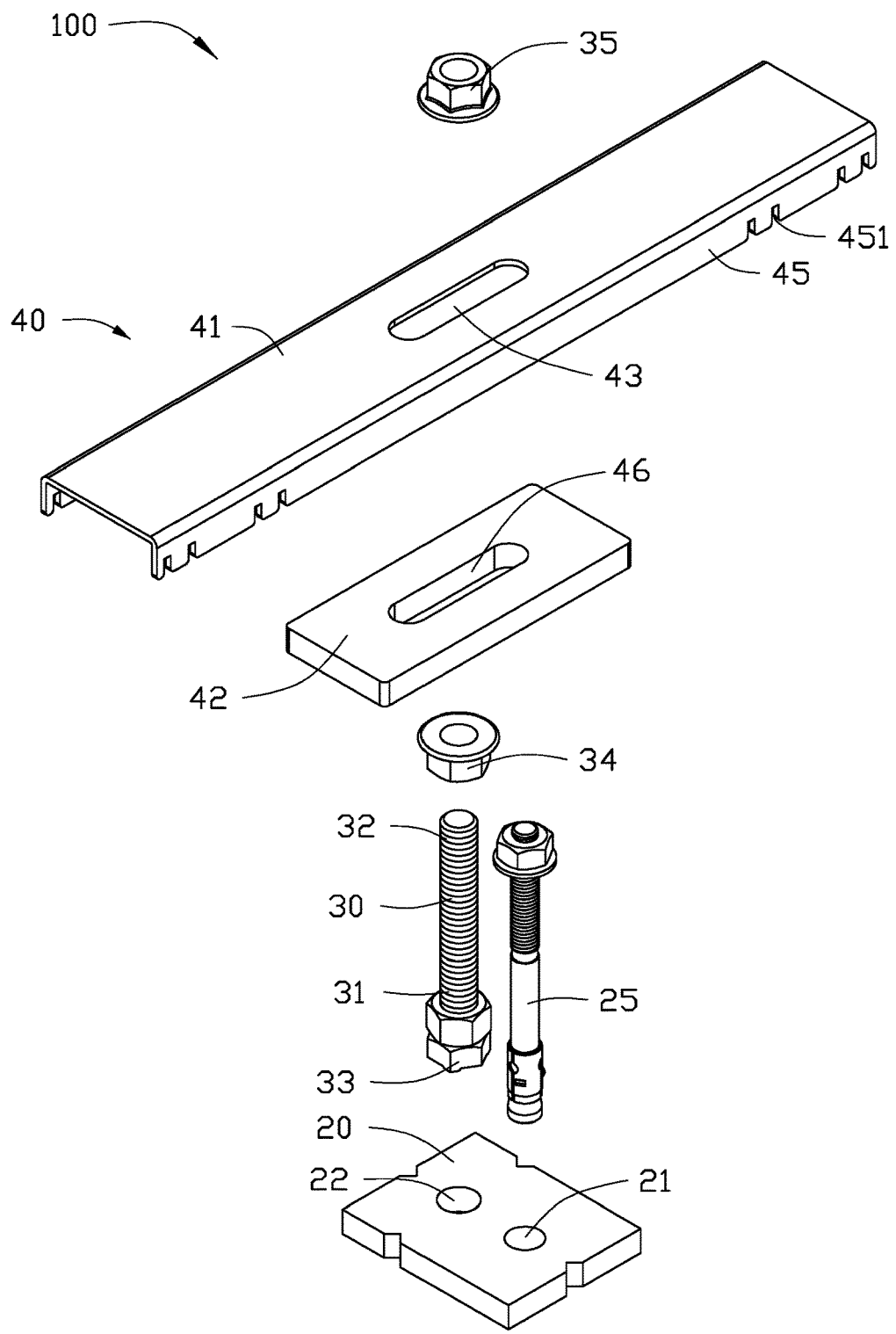
FIG. 3 is an exploded view of the anti-topple device of FIG. 1.
Figure 4:
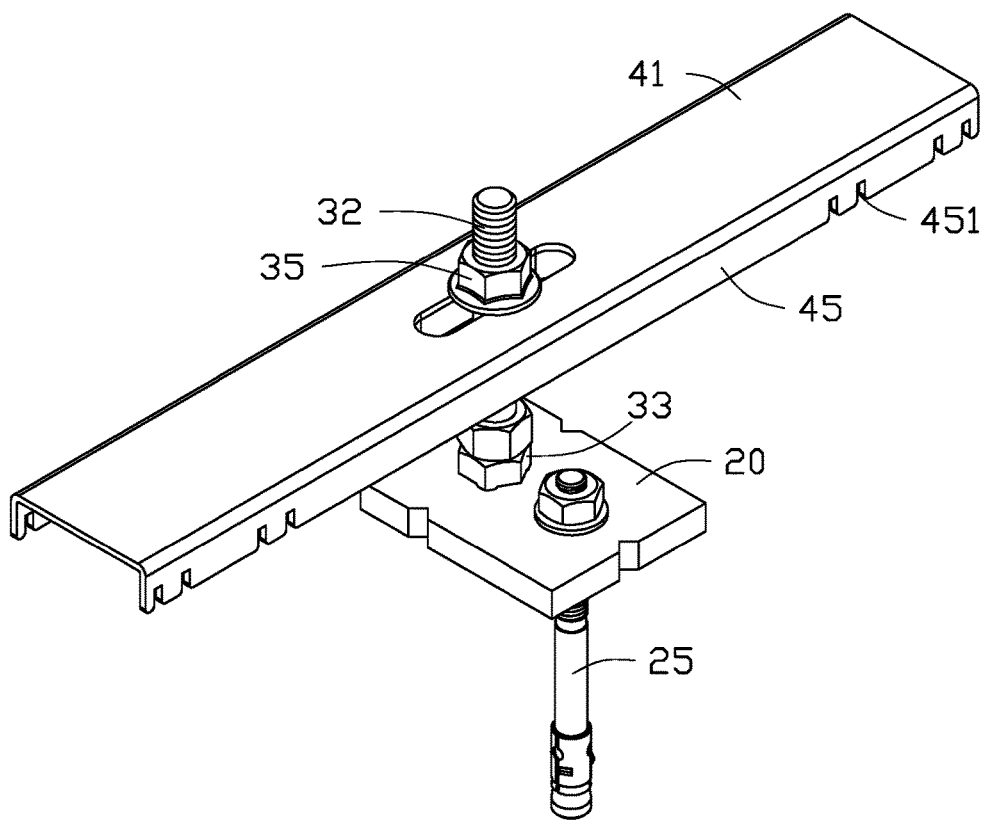
FIG. 4 is an isometric view of the anti-topple device of FIG. 1.

FIGS. 3 and 4 illustrate that the pedestal 20 defines a positioning hole 21 and an installing hole 22. A fixing member 25 is configured to fix the pedestal 20 to the floor 50. In the embodiment, the fixing member 25 is an expansion bolt. The positioning hole 21 has internal thread. The expansion bolt 25 passes through the positioning hole 21 to be fixed in the floor 50 and is screwed into the positioning hole 21 to fix the pedestal 20 to the floor 50.

The screw 30 has an external thread. The screw 30 includes a first end 31 and an opposite second end 32. The installing hole 22 has internal thread. The first end 31 is screwed into the installing hole 22 to fix the screw 20 to the pedestal 20. A nut 33 is screwed onto the screw 30 and abuts against the pedestal 20.

The connecting member 40 includes a connecting plate 41 and two parallel abutting plates 45 extending downward from opposite edges of the connecting plate 41. The connecting member 41 defines a first slot 43 at the middle of the connecting member 41. The elastic block 42 defines a second slot 46 aligned with the first slot 43. The first adjusting member 34 is mounted on the screw 30. The first end 32 passes through the second slot 46 and the first slot 43 to be positioned above the connecting plate 41. The elastic block 42 abuts against between the first adjusting member 34 and the connecting plate 41. The second adjusting member 35 is mounted on the screw 30 and abuts against a side of the connecting plate 41 away from the elastic block 42. Positions of the first adjusting member 34 and the second adjusting member 35 on the screw 30 are adjustable. The first adjusting member 34 and the second adjusting member 35 are two nuts.

Each abutting plate 45 defines a plurality of pairs of grooves 451 positioned at each distal end of the plate 45. The fastening plates 151 are perpendicular to the connecting member 40. The two fastening plates 151 of each beam 15 are received in one pair of grooves 451 to fix the connecting member 40 to the beam 15. Positions of the first adjusting member 34 and the second adjusting member 35 on the screw 30 are adjusted according to a height of the connecting member 40. Thus, the connecting member 40 can be attached to fastening plates 151 which have different heights. When the connecting member 40 is fixed to the beam 15, the cabinet 10 is fixed to the floor 50.

The embodiments shown and described above are only examples. Even though numerous descriptions and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims.

What is claimed is:

1. An anti-topple device mounted in a cabinet, the cabinet comprising two beams positioned at a bottom of the cabinet, each beam comprising a supporting plate and two fastening plates perpendicularly extending upward from opposite ends of the supporting plate, the anti-topple device comprising:
   a pedestal for fixing the cabinet onto a floor;
   a screw, one end of the screw fixed to the pedestal;
   a first adjusting member and a second adjusting member, the first adjusting member and the second adjusting member slidably mounted on the screw; and
   a connecting member adjacent the first adjusting member and abutting against the second adjusting member, the connecting member being arranged between the first adjusting member and the second adjusting member;
   wherein the screw is positioned between the two beams, the connecting member comprises a connecting plate and two parallel abutting plates extending downward from opposite edges of the connecting plate, wherein the two parallel abutting plates are perpendicularly coupled to the two beams of the cabinet, each abutting plate defines two distal ends and a plurality of pairs of grooves positioned at each of the two distal ends, the two fastening plates of each beam are received in two corresponding grooves of the plurality of pairs of grooves positioned at a corresponding one of the two distal ends of each abutting plate.

2. The anti-topple device of claim 1, further comprising an expansion bolt, wherein the pedestal defines a positioning hole, the positioning hole has an internal thread, and wherein the expansion bolt screws into and passes through the positioning hole to fix the pedestal to the floor.

3. The anti-topple device of claim 2, wherein the screw has an external thread, the one end of the screw is a first end of the screw, the screw further comprises a second end opposite to the first end, the pedestal further defines an installing hole, the installing hole has an internal thread, and the first end is screwed into the installing hole to fix the screw to the pedestal.

4. The anti-topple device of claim 3, wherein a nut is screwed onto the screw and abuts against the pedestal.

5. The anti-topple device of claim 1, wherein a gap is defined between the two beams.

6. The anti-topple device of claim 1, further comprising an elastic block, wherein the elastic block abuts against the first adjusting member and the connecting member, the elastic block is arranged between the first adjusting member and the connecting member.

7. The anti-topple device of claim 6, wherein the connecting member defines a first slot, the elastic block defines a second slot aligned with the first slot, the screw passes through the second slot and the first slot to be screwed into the second adjusting member.

8. An anti-topple device mounted in a cabinet, the cabinet comprising two beams positioned at a bottom of the cabinet, each beam comprising a supporting plate and two fastening plates perpendicularly extending upward from opposite ends of the supporting plate, the anti-topple device comprising:
   a pedestal fixed onto a floor, the pedestal used for fixing the cabinet onto the floor;
   a screw fixed to the pedestal;
   a first nut and a second nut, the first nut and the second nut mounted onto the screw; and
   a connecting member adjacent the first nut and abutting against the second nut, the connecting member being arranged between the first nut and the second nut;
   wherein the screw is positioned between the two beams of the cabinet, the connecting member comprises a connecting plate and two abutting plates, the two abutting plates being parallel to each other and extending downward from opposite edges of the connecting plate, wherein the two abutting plates are perpendicularly coupled to the two beams of the cabinet, each abutting plate defines two distal ends and a plurality of pairs of grooves positioned at each of the two distal ends, the two fastening plates of each beam are received in two corresponding grooves of the plurality of pairs of grooves positioned at a corresponding one of the two distal ends of each abutting plate.

9. The anti-topple device of claim 8, further comprising an expansion bolt, wherein the pedestal defines a positioning hole, the positioning hole has an internal thread, and wherein the expansion bolt screws into and passes through the positioning hole to fix the pedestal to the floor.

10. The anti-topple device of claim 9, wherein the screw has an external thread, the screw comprises a first end and a second end opposite to the first end, the pedestal further defines an installing hole, the installing hole has an internal thread, and the first end is screwed into the installing hole to fix the screw to the pedestal.

11. The anti-topple device of claim 10, wherein a third nut is screwed onto the screw and abuts against the pedestal.

12. The anti-topple device of claim 8, wherein a gap is defined between the two beams.

13. The anti-topple device of claim 8, further comprising an elastic block, wherein the elastic block abuts against the first nut and the connecting member, the elastic block is arranged between the first nut and the connecting member.

14. The anti-topple device of claim 13, wherein the connecting member defines a first slot, the elastic block defines a second slot aligned with the first slot, the screw passes through the second slot and the first slot to be screwed into the second nut.

\* \* \* \* \*